United States Patent [19]

Barclay

[11] Patent Number: 5,502,420
[45] Date of Patent: Mar. 26, 1996

[54] CASCODE VCO FREQUENCY MODULATOR

[75] Inventor: Michael J. Barclay, Thirsk, United Kingdom

[73] Assignee: VTech Communications, Ltd., Hong Kong

[21] Appl. No.: 252,409

[22] Filed: Jun. 1, 1994

[30] Foreign Application Priority Data

Jun. 2, 1993 [GB] United Kingdom ............... 9311339

[51] Int. Cl.$^6$ .............. H03B 5/12; H03C 3/16; H03C 3/22
[52] U.S. Cl. ............ 332/135; 331/117 R; 331/117 FE; 331/177 R; 331/177 V; 332/136
[58] Field of Search .................. 331/117 R, 117 FE, 331/177 R, 177 V; 332/135, 136

[56] References Cited

U.S. PATENT DOCUMENTS 5,075,643 12/1991 Einbinder ........................ 332/136
5,245,298 9/1993 Pham .............................. 331/117 R

FOREIGN PATENT DOCUMENTS 1292560 10/1972 United Kingdom .

Primary Examiner—Siegfried H. Grimm
Attorney, Agent, or Firm—Dick and Harris

[57] ABSTRACT

A voltage controlled oscillator apparatus for generating a desired frequency, set by a tuning voltage, toward modulating a transmission signal on the desired frequency. The voltage controlled oscillator apparatus includes an oscillator transistor the base of which is RF live so as to destabilize the transistor such that it oscillates. The oscillator transistor emitter is operably connected through a capacitor to a tank circuit, which stores RF energy at the desired frequency, based on the tuning voltage, to set the oscillator transistor frequency. The inherent collector-base junction capacitance serves to provide voltage variable capacitance resulting in the generation of a carrier signal. The oscillator transistor collector is electrically connected to an amplifier transistor's emitter, such that the amplified transistor and oscillator transistor are in cascode configuration. The amplifier transistor amplifies the transmission signal input at its base and presents a signal output on its collector. Whereby the need for a varactor external to the tank circuit is alleviated and the transmission signal is amplified and modulated on the carrier signal by the amplifier transistor due the interconnection between the oscillator and amplifier transistors in a manner which effectively isolates the transmission signal from the oscillator transistor and tank circuit.

16 Claims, 1 Drawing Sheet

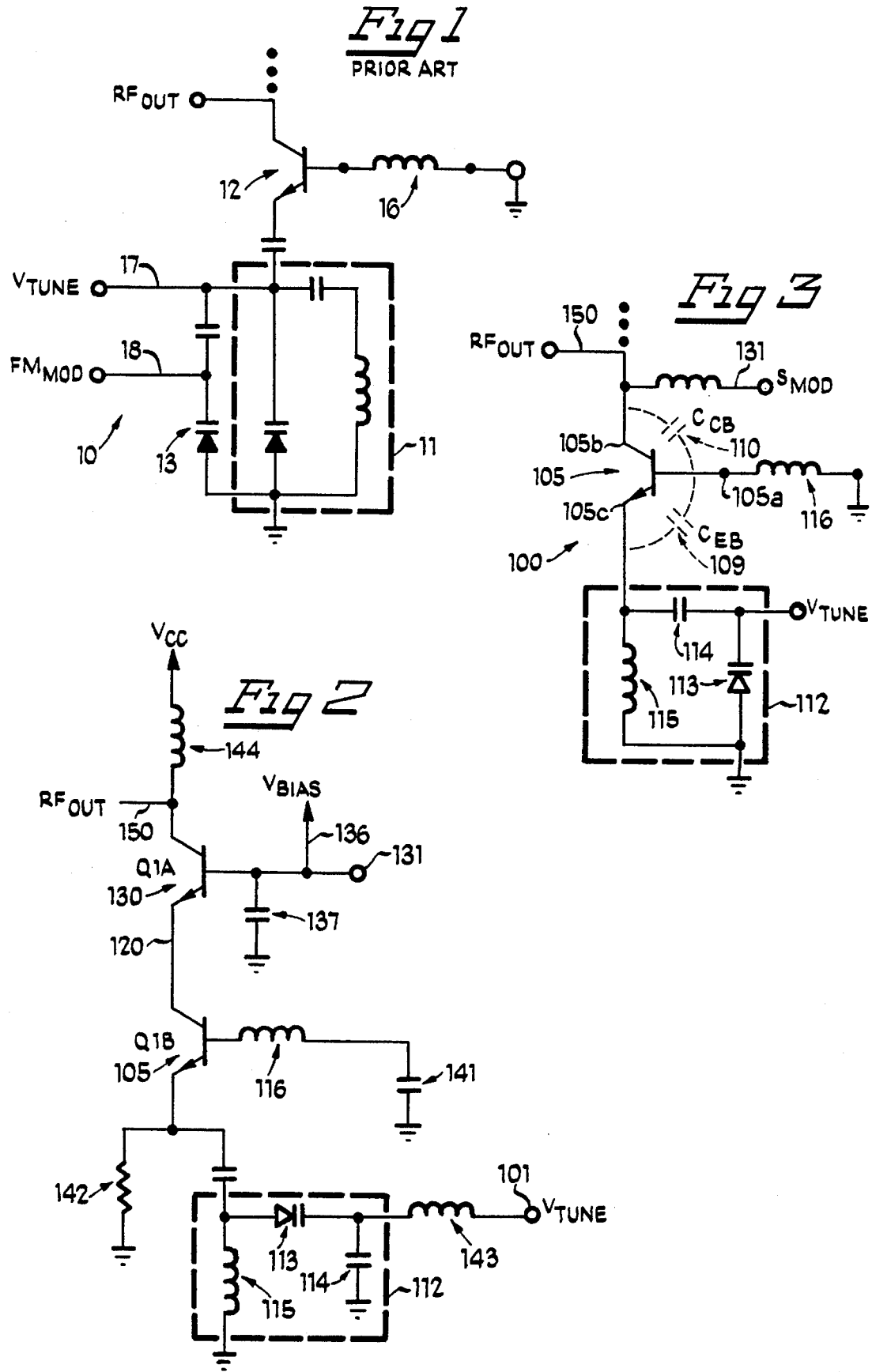

CASCODE VCO FREQUENCY MODULATOR

BACKGROUND OF THE INVENTION

1. Technical Field

The present invention relates in general to a voltage controlled oscillator and, in particular, to a voltage controlled oscillator for generating a desired frequency toward modulating a transmission signal on the generated frequency.

2. Background Art

Voltage controlled oscillators which additionally modulate a transmission signal are well-known in the art. These devices utilize a destablized transistor, either bipolar junction or field effect, to produce a modulated signal. A modulating signal is introduced across a first varactor—a device which exhibits voltage variable capacitance—which in turn frequency modulates the voltage controlled oscillator. The center frequency at which the voltage controlled oscillator oscillates is set in combination with a tank circuit. These tank circuits consist of a capacitor, an inductance and a second varactor across which a voltage is applied to set the center frequency. Thus, the prior art voltage controlled oscillators utilize two varactors, an expensive discrete element.

At radio frequencies, the intended environment for this type of voltage controlled oscillator, the construction of the circuit and the oscillator transistor introduces many parasitic elements which influence the interaction of the tank circuit and the oscillator transistor. In general, the influence of these parasitic elements is to degrade the performance of the voltage controlled oscillator from the optimum obtainable in an ideal circuit.

Designers have typically focused upon removing, or at least alleviating, the effects of these parasitic elements. One such parasitic element is the inherent base to collector capacitance of a junction transistor. Many circuit configurations are known in the prior art to minimize the effect of this particular parasitic element.

It is an object of the present invention not to minimize the effect of the inherent junction capacitance of the oscillator transistor but to actually utilize it in the function of the oscillator.

It is a further object of the present invention to reduce manufacturing cost by removing the varactor used for frequency modulating the voltage controlled oscillator.

It is a further object of the present invention to isolate the transmission signal from the modulation signal so as to provide for a more manageable, controllable design.

This and other objects will become apparent in light of the attached specification and drawings.

SUMMARY OF THE INVENTION

A preferred embodiment of the invention comprises a voltage controlled oscillator apparatus for generating a modulated signal about a desired center frequency, which is set by a tuning voltage.

The voltage controlled oscillator apparatus includes an oscillator transistor. The base of the oscillator transistor is RF live such that the oscillator transistor, in combination with tank circuit means, oscillates at a desired center frequency. The tank circuit means is operably connected to the oscillator transistor emitter. The tank circuit means is a resonant circuit which is a principal element in determining the desired center oscillation frequency of the oscillator transistor.

In a preferred embodiment, the tank circuit means includes a first inductance; a first capacitor; and a varactor means. The varactor means is operably connected to the tuning voltage and tunes the tank circuit means to the desired frequency.

The oscillator transistor collector is operably connected to the emitter of a second transistor, such that the oscillator transistor and second transistor are in a cascode configuration. The second transistor base accepts a modulating signal, which is output onto the second transistor emitter in an emitter-follower configuration. Thus, the modulating signal appears on the inherent collector-base junction capacitance in the oscillator transistor, which serves to provide voltage variable capacitance resulting in the frequency modulation of the oscillation at center frequency.

The resulting modulated signal, a current sourced by the oscillator transistor collector, is amplified by the second transistor which can be thought to be a common-base amplifier with respect to the modulated current. Thus, the modulated signal appears on the second transistor collector where it is the signal output from the apparatus.

It is contemplated as being within the scope of the invention disclosed that field effect transistors (FET's), each having a gate, drain and source, could be utilized as the oscillator and/or second transistors.

This configuration alleviates the need for a varactor external to the tank circuit means and more importantly isolates the function of setting the oscillator center frequency from the function of modulating that frequency, which provides for a more manageable, controllable design.

BRIEF DESCRIPTION OF THE DRAWINGS

FIG. 1 of the drawings is a schematic diagram of a prior art voltage controlled oscillator;

FIG. 2 of the drawings is a schematic diagram of the present voltage controlled oscillator apparatus; and FIG. 3 of the drawings is a schematic diagram of a portion of the present voltage controlled oscillator apparatus showing the junction capacitances of the oscillator transistor.

DETAILED DESCRIPTION OF THE DRAWINGS

While this invention is susceptible of embodiment in many different forms, there is shown in the drawings and will herein be described in detail, one specific embodiment with the understanding that the present disclosure is to be considered as an exemplification of the principles of the invention and is not intended to limit the invention to the embodiment illustrated.

FIG. 1 is a schematic diagram of prior art voltage controlled oscillator 10. Voltage controlled oscillator 10 comprises tank circuit 11; transistor 12; first varactor 13; capacitor 15 and inductor 16. Inductor 16 causes the base of transistor 12 to be RF live which in turn causes transistor 12, in combination with tank circuit 11 and first varactor 13, to oscillate.

Tank circuit 11, a resonant circuit, determines the frequency at which transistor 12 oscillates, as set by $V_{tune}$ 17, a DC voltage, which may be generated by a frequency synthesizer (not shown). The RF energy stored in tank circuit 11 results in transistor 12 oscillating at a particular center frequency. Tank circuit 11 comprises an inductor, a capacitor and a second varactor whose capacitance varies as a function of $V_{tune}$ 17 so as to adjust the RF frequency for which tank circuit 11 stores energy.

The modulating signal, $FM_{mod}$ 18, appears across first varactor 13 in prior art voltage controlled oscillator 10. Inasmuch as the voltage of $FM_{mod}$ 18 varies, the capacitance of first varactor 13 varies, in turn, altering the frequency at which transistor 12 oscillates. Capacitor 15 serves to prevent $V_{tune}$ 17 from further altering the capacitance of first varactor 13 such that its capacitance is dependent only on $FM_{mod}$ 18.

FIG. 2 is a schematic diagram of voltage controlled oscillator apparatus 100. Voltage controlled oscillator apparatus 100 generates a modulated signal at a desired center frequency. This center frequency is set by tuning voltage 101, a DC voltage which may be generated as part of a frequency synthesizer (not shown).

Voltage controlled oscillator apparatus 100 includes oscillator transistor 105 and second transistor 130, which are connected together in a cascode configuration. Oscillator transistor 105 is a radio frequency bipolar junction transistor having base 105a, collector 105b and emitter 105c. Inasmuch as oscillator transistor 105 is a bipolar junction transistor, it contains inherent junction capacitances $C_{CB}$ 110 and $C_{EB}$ 109, shown in FIG. 3 of the drawings. Second transistor 130 in a preferred embodiment is also a radio frequency bipolar junction transistor having base 130a, collector 130b and emitter 130c.

As in the prior art, oscillator transistor 105 oscillates at a frequency dependent upon its inherent junction capacitances 109 and 110, the value of tank circuit means 112 and the value of tuning voltage 101. However, as can be clearly seen by comparing FIG. 2 to FIG. 1 of the drawings, there is only one varactor in apparatus 100 (shown in FIG. 2)—varactor 113 found in tank circuit means 112.

Furthermore, the modulating signal, $FM_{mod}$ 18 (shown in FIG. 1) was input across varactor 13 which, in turn, was operably connected to tank circuit 11 in prior art voltage controlled oscillator 10. In apparatus 100, shown in FIG. 2, the modulating signal, $S_{mod}$ 131 is input on the collector side of oscillator transistor 105 through second transistor 130 in a manner described more fully hereinbelow. These differences result in a more manageable, controllable and less expensive design.

Tank circuit means 112, in combination with oscillator transistor 105, determines the frequency at which oscillator transistor 105 oscillates. This desired center frequency varies as a function of tuning voltage 101, which is fed across varactor means 113. The effective capacitance of varactor means 113, which may comprise a varactor or a reverse-biased diode, varies as a function of tuning voltage 101. This capacitance is combined with the capacitance of capacitor 114 and the inductance of inductor 115 to form tank circuit means 112. It is contemplated that the capacitance of capacitor 114 may or may not dominate over the capacitance of varactor 113 in light of the operating range and center frequency chosen. Inductor 115 may comprise a coil inductor, an element printed directly on the circuit board or any other means known in the art for providing an inductance.

Inductor 116 is connected between base 105a and RF ground, which is grounded by capacitor 141. Base 105a is thus made RF live so as to destabilize oscillator transistor 105 such that it can oscillate in combination with tank circuit means 112.

Oscillator transistor 105 would merely oscillate at the frequency arrived at in combination with tank circuit means 112 as set by tuning voltage 101 without additional elements. However, in combination with second transistor 130 and modulating signal 131, apparatus 100 produces a modulated signal at signal output 150, which is modulated about a center frequency. Second transistor 130 is a reflex circuit, which due to capacitor 137 appears as an emitter-follower to modulating signal 131 and as a common-base amplifier to the current being sunk by collector 105b. This duality makes the design of apparatus 100 more controllable.

The emitter-follower aspect of second transistor 130 dictates that the voltage on base 130b—modulating signal 131—appears on emitter 130c and, in turn, on collector 105b. This voltage is applied to inherent collector-base junction capacitance 110, which is a voltage-variable capacitance on the order of 0.5 picofarads. By altering this capacitance, the frequency of oscillation is altered resulting in modulated signal 120, which varies about the center frequency. Modulated signal 120 is a varying current—in fact the voltage on collector 105b and emitter 130c are determined solely by the value of modulating signal 131 as applied to base 130a.

The common-base amplifying aspect of second transistor 130 dictates that the current on emitter 130c—modulated signal 120—appears on collector 130b or signal output 150, which is separated from the voltage supply by RF choke 144. In this case, capacitor 137 RF grounds base 130a, so as to configure the common-base configuration. Thus, apparatus 100 provides a frequency modulated signal on signal output 150 utilizing a more manageable, controllable design.

The foregoing description and drawings merely explain and illustrate the invention and the invention is not limited thereto, except insofar as the appended claims are so limited and as those skilled in the art who have the disclosure before them will be able to make modifications and variations therein without departing from the scope of the invention.

What is claimed is:

1. A voltage controlled oscillator apparatus for generating a modulated signal at a desired center frequency, the desired center frequency being set by a tuning voltage, said voltage controlled oscillator apparatus comprising:

an oscillator transistor having a base, a collector and an emitter, the junction between said oscillator transistor base and said oscillator transistor collector having an inherent junction capacitance, said oscillator transistor collector-base junction capacitance serving to provide voltage variable capacitance resulting in the generation of the modulated signal having received a modulating signal;

tank circuit means for determining the desired center frequency, said tank circuit means being electrically connected to the tuning voltage and said oscillator transistor emitter;

said oscillator transistor base being RF live so as to destabilize said oscillator transistor such that it oscillates due to its interaction with said tank circuit means; and a second transistor having a base, a collector and an emitter, said second transistor emitter connected to said oscillator transistor collector such that said second transistor and said oscillator transistor are in cascode configuration, said second transistor base being RF grounded and accepting as an input said modulating signal, which is output onto said second transistor emitter toward modulating said oscillator transistor, said second transistor further serving to amplify the modulated signal generated by said oscillator transistor collector-base junction capacitance in response to said modulating signal onto a signal output, whereby the need for a varactor external to said tank circuit means is alleviated and the interconnection between said oscillator transistor and said second transistor effectively isolates the modulating signal from said oscillator transistor and said tank circuit means.

2. The invention according to claim 1 wherein said tank circuit means comprises:

a first inductance;

a first capacitor; and varactor means operably connected to the tuning voltage for tuning said tank circuit means to the desired frequency.

3. The invention according to claim 2 wherein said varactor means is a varactor.

4. The invention according to claim 2 wherein said varactor means is a diode.

5. A voltage controlled oscillator apparatus for generating a modulated signal at a desired center frequency, the desired center frequency being set by a tuning voltage, said voltage controlled oscillator apparatus comprising:

an oscillator transistor having a gate, a drain and a source, the junction between said oscillator transistor gate and said oscillator transistor drain having an inherent junction capacitance, said oscillator transistor gate-drain junction capacitance serving to provide voltage variable capacitance resulting in the generation of the modulated signal having received a modulating signal;

tank circuit means for determining the desired center frequency, said tank circuit means being electrically connected to the tuning voltage and said oscillator transistor source;

said oscillator transistor gate being RF live so as to destabilize said oscillator transistor such that it oscillates due to its interaction with said tank circuit means; and a second transistor having a gate, a drain and a source, said second transistor source operably connected to said oscillator transistor drain such that said second transistor and said oscillator transistor are in cascode configuration, said second transistor gate being RF grounded and accepting as an input said modulating signal, which is output onto said second transistor source toward modulating said oscillator transistor, said second transistor further serving to amplify the modulated signal generated by said oscillator transistor gate-drain junction capacitance in response to said modulating signal onto a signal output, whereby the need for a varactor external to said tank circuit means is alleviated and the interconnection between said oscillator transistor and said second transistor effectively isolates the modulating signal from said oscillator transistor and said tank circuit means.

6. The invention according to claim 5 wherein said tank circuit means comprises:

a first inductance;

a first capacitor; and varactor means operably connected to the tuning voltage for tuning said tank circuit means to the desired frequency.

7. The invention according to claim 6 wherein said varactor means is a varactor.

8. The invention according to claim 6 wherein said varactor means is a diode.

9. A voltage controlled oscillator apparatus for generating a modulated signal at a desired center frequency, the desired center frequency being set by a tuning voltage, said voltage controlled oscillator apparatus comprising:

an oscillator transistor having a base, a collector and an emitter, the junction between said oscillator transistor base and said oscillator transistor collector having an inherent junction capacitance, said oscillator transistor collector-base junction capacitance serving to provide voltage variable capacitance resulting in the generation of the modulated signal having received a modulating signal;

tank circuit means for determining the desired center frequency, said tank circuit means being electrically connected to the tuning voltage and said oscillator transistor emitter;

said oscillator transistor base being RF live so as to destabilize said oscillator transistor such that it oscillates due to its interaction with said tank circuit means; and a second transistor being of the field effect type having a gate, a drain and a source, said second transistor source connected to said oscillator transistor collector such that said second transistor and said oscillator transistor are in cascode configuration, said second transistor gate being RF grounded and accepting as an input said modulating signal, which is output onto said second transistor source toward modulating said oscillator transistor, said second transistor further serving to amplify the modulated signal generated by said oscillator transistor collector-base junction capacitance in response to said modulating signal onto a signal output, whereby the need for a veractor external to said tank circuit means is alleviated and the interconnection between said oscillator transistor and said second transistor effectively isolates the modulating signal from said oscillator transistor and said tank circuit means.

10. The invention according to claim 9 wherein said tank circuit means comprises:

a first inductance;

a first capacitor; and varactor means operably connected to the tuning voltage for tuning said tank circuit means to the desired frequency.

11. The invention according to claim 10 wherein said varactor means is a varactor.

12. The invention according to claim 10 wherein said varactor means is a diode.

13. A voltage controlled oscillator apparatus for generating a modulated signal at a desired center frequency, the desired center frequency being set by a tuning voltage, said voltage controlled oscillator apparatus comprising:

an oscillator transistor having a gate, a drain and a source, the junction between said oscillator transistor gate and said oscillator transistor drain having an inherent junction capacitance, said oscillator transistor gate-drain junction capacitance serving to provide voltage variable capacitance resulting in the generation of the modulated signal having received a modulating signal;

tank circuit means for determining the desired center frequency, said tank circuit means being electrically connected to the tuning voltage and said oscillator transistor source;

said oscillator transistor gate being RF live so as to destabilize said oscillator transistor such that it oscillates due to its interaction with said tank circuit means; and a second transistor being of the bipolar junction type having a base, a collector and an emitter, said second transistor emitter operably connected to said oscillator transistor drain such that said second transistor and said oscillator transistor are in cascode configuration, said second transistor base being RF grounded and accepting as an input said modulating signal, which is output onto said second transistor emitter toward modulating said oscillator transistor, said second transistor further serving to amplify the modulated signal generated by said oscillator transistor gate-drain junction capacitance in response to said modulating signal onto a signal output, whereby the need for a varactor external to said tank circuit means is alleviated and the interconnection between said oscillator transistor and said bipolar junction transistor effectively isolates the modulating signal from said tank circuit means.

14. The invention according to claim 13 wherein said tank circuit means comprises:

a first inductance;

a first capacitor; and varactor means operably connected to the tuning voltage for tuning said tank circuit means to the desired frequency.

15. The invention according to claim 14 wherein said varactor means is a varactor.

16. The invention according to claim 14 wherein said varactor means is a diode.

* * * * *